May 4, 1971 R. F. RUTZ 3,577,285
METHOD FOR EPITAXIALLY GROWING SILICON CARBIDE
ONTO A CRYSTALLINE SUBSTRATE
Filed March 28, 1968

INVENTOR
RICHARD F. RUTZ

BY S. P. Tedesco
ATTORNEY

United States Patent Office 3,577,285

Patented May 4, 1971

3,577,285

METHOD FOR EPITAXIALLY GROWING SILICON CARBIDE ONTO A CRYSTALLINE SUBSTRATE

Richard F. Rutz, Cold Spring, N.Y., assignor to International Business Machines Corporation, Armonk, N.Y.

Filed Mar. 28, 1968, Ser. No. 716,928
Int. Cl. H01l *7/36;* C01b *31/36;* C23c *11/00*
U.S. Cl. 148—175 9 Claims

ABSTRACT OF THE DISCLOSURE

Epitaxial growth of semiconductive materials is effected in an inert atmosphere by physically contacting the surfaces of a source of semiconductive material to particular surface areas of a crystalline substrate onto which such growth is to be effected. The source is heated to a temperature to cause rapid vaporization of the semi-conductive material; the substrate is maintained at a slightly lower temperature to promote the condensation and epitaxial growth of the vaporized semiconductive material on the contacted substrate surfaces. The surface of the source can be preformed so as to grow particular patterns of the semiconductive material onto the substrate surface. Conductivity-type determining impurities can be introduced either into the inert atmosphere or be present in the source so as to impart a particular conductivity to the grown semiconductive material.

BACKGROUND OF THE INVENTION

The present invention relates to epitaxial deposition processes and, more particularly, to processes for epitaxially depositing particular patterns of semi-conductive material in avoidance of physical masking techniques. In its more particular aspects, the present invention relates to the formation of PN junctions in silicon carbide (SiC) to form active semiconductive devices.

SiC is one of the earliest-known semiconductive materials but, because of its refractory nature, the use of such material in active semiconductive devices has been difficult and involved. To date, SiC has been used in the fabrication of rectifying and electroluminescent diodes. The using of SiC in active semiconductor devices is desirable because of its wide-band gap and, also, such devices can be operated at higher temperatures, e.g. in the range of 500° C., and are inherently inert, rugged, and resistive to radiation damage. For example, the desirability of employing SiC in electroluminescent diodes is that, due to its wide-band gap in the order of 3.0 ev., light output can be achieved in the visible and ultraviolet region.

One of the problems which has plagued industry has been the difficulty in forming reproducible PN junctions in SiC material of particular geometry. In the prior art, PN junctions have been formed in SiC in Lely-type furnaces wherein elemental silicon and carbon along with appropriate p-type or n-type impurities, e.g. boron or nitrogen, respectively, are reacted at a high temperature to form platelets. The main limitation of such process has been the fact that platelets are formed having irregular, and uncontrollable geometries. In such process, doped regions are formed over the entire surface of the platelets which requires that the platelets be worked to achieve an appropriate device structure. Moreover, positive control of the doping gradient defining such junctions is difficult to control and, hence, not reproducible. Such process has been described, for example, in Silicon Carbide, edited by J. R. O'Connor et al., Pergamon Press, New York 1960, at page 453.

Considerable effort has been directed to epitaxial, diffusion, and alloying techniques for forming PN junctions in SiC material. For example, epitaxial techniques have been described in "Epitaxial Growth of Silicon Carbide by the Thermal Reduction Technique" by R. B. Campbell, et al., Journal of the Electro-Chemical Society, August 1966, page 825, and "Epitaxial Growth of Silicon Carbide" by R. W. Brander, Journal of the Electra-Chemical Society, July 1964, page 881. Prior art diffusion and alloying techniques to form such junctions have been described in the above-identified book edited by J. R. O'Connor et al. and "Electrical Contacts to Silicon Carbide" by R. N. Hall, Journal of Applied Physics, June 1958, pages 914–917, respectively. The epitaxial technique, however, appears to be most promising. For example, due to the very tight bonding between the silicon and carbon in the crystal lattice, diffusion of impurities must be effected at extremely high temperatures, e.g., in the range of 2000° C., and for extended periods. In such high-temperature processes, physical masking to control the diffusion of impurities is difficult.

Also, prior art alloying techniques suffer the limitation of geometry and doping control and p-n junctions so formed tend to have excessive leakage, or soft-breakdown, characteristics. In the prior art, epitaxial deposition of SiC has been achieved by passing vapors including elemental silicon and carbon over the surface of a silicon carbide substrate, or seed. These vapors can be produced by decomposing SiC, by cracking compounds such as silicon tetrachloride ($SiCl_4$) and carbon tetrachloride ($CCl_4$) or by vaporizing the elements silicon and carbon. Such vaporized material is deposited epitaxially onto the substrate surface in crystalline form, i.e., the depositant is crystallographically compatible with the substrate material. Appropriate dopings can be included in such vapors to impart desired conductivity to the depositant so as to form PN junctions between successive layers of the depositant. Again, due to the excessive deposition temperatures, e.g. in the range of 2000° C., it has been difficult to employ physical masking techniques so as to deposit particular depositant geometries. Also such process suffers from the fact that precise control of the composition of the vapors is required since an excessive unbalance of the species depositing on the substrate surface tends to create inclusions in the grown layer.

Accordingly, an object of this invention is to provide a convenient and fast process for forming PN junctions in semiconductive materials.

Another object of this invention is to provide predetermined patterns of semiconductive materials.

Another object of this invention is to provide a novel process for epitaxially depositing SiC in precise patterns.

Another object of this invention is to provide a novel process for forming PN junctions in SiC.

SUMMARY OF THE INVENTION

These and other objects and advantages are achieved by intimately contacting the surfaces of a source of depositant, e.g. SiC, AlN, or other semiconductor materials, and a substrate, or seed, onto which the epitaxial deposition is to be effected in an inert atmosphere and at an elevated temperature, a slight temperature difference existing between the source and seed. The source and substrate each have planar surfaces, either chemically or mechanically polished and free from unwanted contaminants. The source is maintained at a sufficiently elevated temperature such as to cause the SiC to sublime, e.g. in the range of 1700° C. to 2200° C., whereby the vapors are confined between the contacted surfaces and condense and grow on the cooler substrate. Due to the highly localized confinement of the SiC vapors, there is almost a direct transfer of the SiC in the vapor phase onto the contacted cooler substrate surface at a very high rate and minimal dispersion to regions outside the contacted areas.

In the case of SiC, it has been observed that the presence of hydrogen substantially increases the growth rate.

In accordance with other aspects of this invention, SiC patterns can be epitaxially grown on the substrate in avoidance of physical masking by preforming the surface of the source such that only particular surface areas of the substrate are contacted. The surface of the source can be mechanically eroded in a selected positive pattern corresponding to the pattern of SiC to be grown on the substrate surface. It has been observed that the growth rate is very significantly reduced when the surfaces of the source and substrate are not contacted. The source surface is eroded sufficiently such that substantially no growth occurs on uncontacted surface areas of the substrate whereby a plurality of mesa-type SiC patterns are deposited. By introducing appropriate conductivity-type determining impurities into the vapor stream or into the source proper, SiC layers of particular-type conductivity can be grown successively to define a PN junction. To insure electrical isolation between the grown SiC patterns, the final structure can be exposed to an appropriate etchant, e.g. hot sodium hydroxide (NaOH) or hydrogen ($H_2$) vapors at elevated temperatures in the case of SiC, for a time sufficient to expose the substrate surfaces between the grown SiC patterns so as to remove any material which may have grown on uncontacted surfaces of the substrate.

The foregoing and other objects, features and advantages of the invention will be apparent from the following more particular description of preferred embodiments of the invention, as illustrated in the accompanying drawings.

DESCRIPTION OF THE INVENTION

Figure 1:
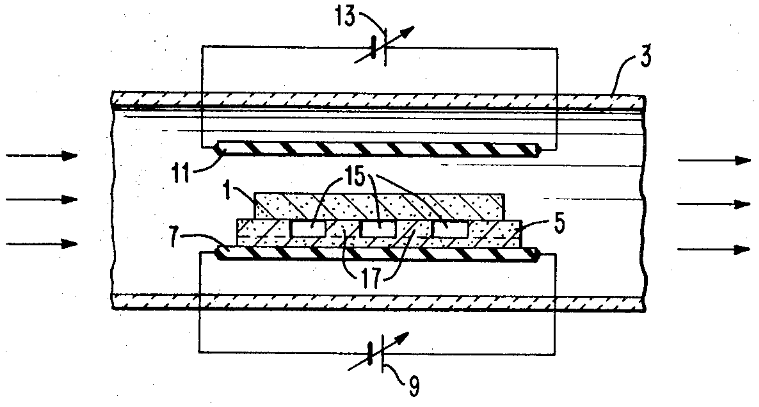
FIG. 1 is a schematic representation of a system for practicing the novel process of this invention.

Referring to FIG. 1, the system comprises an open-ended elongated chamber 3 formed of appropriate inert material, e.g., Pyrex glass. SiC source 5, which may be either a single crystal or polycrystalline material, is positioned along chamber 3 and on carbon heating element 7, which is connected to external variable voltage source 9. Also, crystalline substrate 1 is formed of a material which will promote the high-temperature epitaxial growth of SiC vaporized from source 5 when such vapors are condensed thereon. Preferably, source 5 and substrate 1 are formed of the same material, i.e., SiC. Surface areas of substrate 1 onto which epitaxial growth is to be effected are in intimate contact with the surface of source 5. The contacted surfaces of substrate 1 and source 5 are planar and free from unwanted contaminants and mechanical damage. For example, the surfaces of substrate 1 and source 5 can be polished by exposure within chamber 3 to hydrogen ($H_2$) at a temperature in the range of 1700° C. Carbon heating element 11 connected to external variable voltage source 13 is positioned above substrate 1. When heating element 7 is energized, substrate 1 is heated in the range of 1700° C.–2200° C. to support the vaporization of source 5 and generate SiC vapors at least between the contacted surfaces of substrate 1 and source 5. Heating element 11 is controlled to establish a slight temperature difference between substrate 1 and source 5, e.g. less than 50° C., so as to cause the epitaxial growth process to proceed from the hotter source to the colder substrate. Heating elements 7 and 11 should be formed of a compatible material so as not to contaminate the epitaxial growth process. For example, in the case of AiN, heating elements 7 and 11 are preferably formed of tantalum (Ta) to avoid the formation of unwanted carbides and nitrides. During the growth process, an inert atmosphere, e.g. argon (Ar), is introduced at or near atmosphere pressure and directed along chamber 3 as indicated by the arrows. The growth rate can be increased by the presence of hydrogen in the ambient. The effect of hydrogen in the ambient can be used to advantage by discontinuing the flow of hydrogen at the beginning and end of the growth process while the temperature of substrate 1 and source 5 is being raised and lowered from room temperature so as to prevent excessive unwanted and uncontrolled growth of SiC on substrate 1.

As hereinafter described, the epitaxial growth of SiC proceeds at a very rapid rate on surfaces of substrate 1 in direct contact with the surfaces of source 5; SiC growth on uncontacted surfaces of substrate 1 proceeds at a very much slower rate. Accordingly, SiC patterns grown on substrate 1 can be controlled, or masked, by preforming the surface of source 5 to define a positive pattern, the raised portions, or plateaus, each providing an independent SiC source for the corresponding portion of substrate 1. As illustrated, a plurality of parallel grooves 15 can be mechanically eroded in orthogonal fashion into the surface of source 5 by a diamond saw or ultrasonic process to define a plurality of raised portions 17 having upper surfaces in a same plane and each contacting the surface of substrate 1. When a continuous layer of silicon carbide is to be grown on substrate 1, source 5 is not preformed so as to contact the entire surface of substrate 1.

When heating element 7 is energized and the temperature of substrate 1 is raised in exces of 1700° C., source 5 sublimes and SiC vapors are confined between the contacted surfaces. These SIC vapors tend to condense onto the slightly cooler contacted surfaces of substrate 1 at a very fast rate, e.g., 2.5 mils in 15 minutes have been deposited at an average temperature of 1950° C. This very fast growth rate is due to the high diffusion rate between the contacted surfaces of substrate 1 and source 5 caused by the large temperature gradient and the close proximity of the substrate surface which acts as a sink for the SiC vapors. The growth rate on uncontacted surfaces of substrate 1 falls off very rapidly with separation distance since the temperature gradient between opposing surfaces of source 5 is decreased and the process becomes diffusion limited. It has been observed that a separation distance of a few mils is sufficient to reduce the growth rate by a factor of 50 or more. When the temperature difference between substrate 1 and source 5 is large, i.e., more than approximately 50° C., SiC grown on the surface of substrate 1 tends to become polycrystalline and random nucleation appears to ocur. As the temperature difference between substrate 1 and source 5 is reduced, say in the range of 30° C. and below, SiC grown on the substrate becomes more perfect and uniform. Apparently, SiC vapors between the contacted surfaces tend to deposit onto the surface of substrate 1 at a lower rate to produce the more perfect and uniform growth. The growth rate also varies directly as a function of the absolute temperature of source 5.

In addition, the particular temperature range affects the crystalline form of the SiC grown on substrate 1. For example, when the temperature of substrate 1 is at least 1950° C., 6H or, α-phase, SiC has been grown on a 6H-SiC substrate and at a rate of .1 mil/min. However, when the temperature is below at least 1950° C., cubic or 3C, or β-phase, SiC tends to grown on a 6H-SiC substrate. A heterojunction results due to the differences in the energy band gaps of SiC in the different polystates. For example, the energy gap of 6H-SiC is approximately 2.8 ev. and of 3C-SiC is approximately 2.3 ev., such that active semiconducting devices including heterojunctions can be formed.

The SiC grown onto substrate 1 can be doped to exhibit either p-type or n-type conductivity either by introducing appropriate impurities into chamber 3, e.g., boron or nitrogen, respectively, or by forming source 5 of particular conductivity-type material. Contacting the surfaces of substrate 1 and source 5 is effective not only to transfer and grow SiC but, also, impurities present in source 5. In such event, the epitaxially grown SiC exhibits a same conductivity as the source; to form PN junctions, therefore, sources 5 of opposite conductivity types are substituted in the system. In the case of certain impurities. e.g. aluminum (Al), the rate of transfer of such impurities is substantially lower than that of the SiC. Accordingly, the SiC grown on substrate 1 has a slightly lower impurity density than source 5. By repeated reversals of the temperature difference between substrate 1 and source 5 whereby epitaxial growth is effected alternately on the surfaces of the substrate and source, a purification with respect to these impurities occurs which can be used to produce an epitaxial growth more free of impurities than source 5. Such technique can be used to obtain very pure layers of SiC. Alternatively, when source 5 is formed of substantially pure or intrinsic SiC, the appropriate impurity can be introduced in gaseous form in the ambient along chamber 3. In such event, the gaseous impurity penetrates between the contact surfaces of substrate 1 and source 5 to impart a particular conductivity to the grown SiC.

Figure 2A:
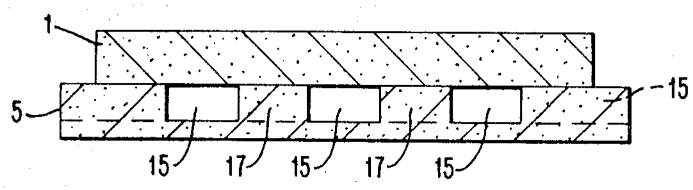
FIGS. 2A–2D illustrate a sequence of steps for forming PN junctions in particular patterns of semiconductor material grown on a crystalline substrate surface.
Figure 2B:
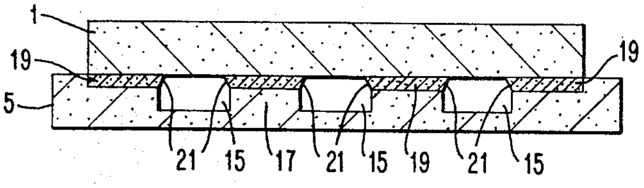

The process as described is more particularly illustrated in FIGS. 2A–2D, which illustrate the sequence for fabricating PN junctions in a plurality of SiC patterns grown on a single substrate. As shown in FIG. 2A, substrate 1 and source 5 are formed of substantially pure SiC so as to exhibit a high electrical resistivity. Source 5 is preformed, as hereinabove described, and supports substrate 1 on its upper surface. While a 90% Ar–10% $H_2$ atmosphere is directed, for example, at 0.5 liter/min. along chamber 3 of FIG. 1 and the temperature of substrate 1 and source 5 have been raised in excess of 1700° C. to provide a slight temperature difference therebetween, e.g. approximately 20° C., an appropriate gaseous impurity, for example, boron, is introduced concurrently into the ambient flow. As hereinabove described, the presence of hydrogen substantially increases the growth rate of the SiC onto the contacted surfaces of substrate 1. The growth of SiC on the contacted surfaces of substrate 1 proceeds at a very rapid rate causing discrete regions 19 of p-type SiC to grow on substrate 1; the growth of SiC on uncontacted portions of substrate 1 proceeds at a very much slower rate such that a minimal and discontinuous growth is achieved thereon. As shown in FIG. 2B, the growth of patterns 19 occurs only on surfaces of substrate 1 in contact with source 5. In addition, due to the proximity of uncontacted surface of substrate 1 and the walls of grooves 15 fillets 21 tend to grow on the uncontacted surfaces adjacent patterns 19. Such fillets 19 extend only a short distance onto uncontacted surfaces of substrate 1, approximately equal to the thickness of growth, and are ineffective to electrically contact adjacent patterns 19.

During the growth process, SiC is rapidly transferred from source 5 and grown onto substrate 1 whereas loss from exposed portions of source 5 proceeds at a much slower rate. This is due to the rapid condensation of the SiC vapors onto contacted portions of substrate 1, whereas growth on uncontacted portions of substrate 1 appears to be diffusion limited due to the layer spacing therebetween and source 5. Accordingly, due to the very close spacing of the contacted surfaces, the contacted surfaces of substrate 1 act as a sink for the SiC vapors whereby the contacted surfaces of source 1 are vaporized at a faster rate than the uncontacted surfaces, and regions 17 appear to grow into the source 5 as shown in FIG. 2B. The efficiency of transfer, i.e. the ratio of the material grown on substrate 1 to the material loss to source 1, can be expected to be in excess of 50%.

When regions 17 have been formed, the flow of both hydrogen and boron along chamber 3 is discontinued whereby further growth of regions 17 is substantially inhibited. When chamber 3 has been flushed, an n-type gaseous impurity, e.g. nitrogen, and hydrogen are introduced concurrently into the ambient. As the process proceeds, the further growth 23 on substrate 1 is of p-type conductivity so as to define abrupt PN junctions 25 with regions 17. Again, p-type fillets 27 extend slightly over uncontacted surfaces of substrate 1. The process is continued for a time sufficiently short that the SiC growth on uncontacted portions of substrate 1 is minimal and electrically discontinuous.

Figure 2C:
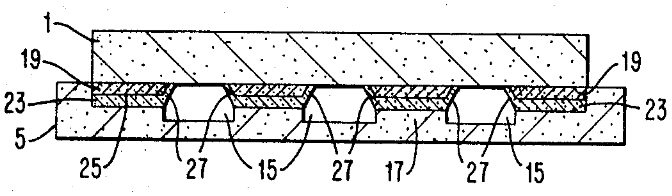
Figure 2D:
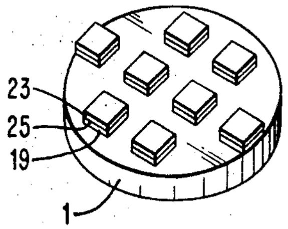

Since neither substrate 1 or source 5 are heated in excess of their respective melting temperature, there is no fusion between the substrate and source. At the completion of the growth process, substrate 1 is readily separable from source 5. Growth on substrate 1 can be continued in the same fashion so as to provide successive growths of alternating conductivity types, e.g. PNP or NPN the respective thicknesses of such layers being both time and temperature dependent. To insure electrical isolation between grown patterns, substrate 1 as shown in FIG. 2C can be exposed to an appropriate SiC etchant, e.g. hot NaOH, for a time sufficient to expose the surfaces of substrate 1 between the grown patterns. In accordance with the described process, an array of electrically isolated SiC junction devices, or diodes, are formed on a same substrate 1 as shown in FIG. 2D. Substrate 1 can be removed by mechanical tapping to define a plurality of individual diode devices to which electrical contacts can be made to regions 19 and 23. Alternatively, in FIG. 2D, portions of regions 19 can be exposed to allow electrical connections by selectively etching portions of regions 23 in accordance with the above-described process. For example, portions of regions 23 to be etched can be contacted by a preformed SiC wafer which has been mechanically eroded to provide a required positive pattern. Such SiC wafer and the structure of FIG. 2D can be positioned in proper contact within chamber 3 and heated in excess of 1700° C. with the temperature gradient established to favor growth away from regions 23 and onto the contacted surfaces of the preformed SiC wafer for a time sufficient to expose the underlying surface portions of regions 19.

While the invention has been particularly shown and described with reference to preferred embodiments thereof, it will be understood by those skilled in the art that various changes in form and details may be made therein without departing from the spirit and scope of the invention. For example, the principles hereinabove described are suitable for purification of semiconductive materials by alternating the temperature difference between two contacting semiconductive bodies, i.e., between substrate 1 and source 5, and to the etching of a semiconductive body since the loss of semiconductive material is greater at the contacting surface than at the uncontacted surface of that body maintained at the slightly higher temperature. Also, while substrate 1 has been described as being of substantially pure semiconductive material, it is evident that said substrate can be formed of particular conductivity-type semiconductive material and each of the grown patterns formed of opposite conductivity-type semiconductive material so as to define a plurality of PN junction devices having a common electrode.

What is claimed is:

1. A process for epitaxially depositing silicon carbide onto a crystalline substrate, comprising:

physically contacting a solid source of silicon carbide on a single crystal substrate, said substrate having lattice parameters which are compatible with the deposited silicon carbide;

introducing an inert atmosphere at substantially atmospheric pressure in the vicinity of said source and substrate;

heating said silicon carbide source to an elevated temperature sufficient to vaporize said source, said temperature being below the melting point of said source and said substrate;

maintaining a temperature difference between said silicon carbide source and said substrate of less than 50° to condense said vaporized silicon carbide source epitaxially onto the portions of said substrate which are contacted by said source.

2. The process of claim 1, including the further step of preforming the surface of said silicon carbide source in contact with said substrate to define a positive pattern corresponding to selected surface areas of said substrate, said silicon carbide material depositing epitaxially on said substrate in said patterns, wherein said preforming step is done before said source and substrate are contacted.

3. The process of claim 2, including the further step of removing silicon carbide material from those portions of the substrate which were uncontacted by said silicon carbide source.

4. The process of claim 1, wherein impurities are introduced into said inert atmosphere, said impurities penetrating between contacted surfaces of said silicon carbide source and said substrate to impart a particular conductivity to said epitaxially grown silicon carbide.

5. The process of claim 4, wherein different conductivity determining impurities are sequentially introduced into said inert atmosphere to form a PN junction in said epitaxially grown silicon carbide.

6. The process of claim 1, wherein said silicon carbide source has impurities therein which are transferred to said epitaxially grown silicon carbide during said deposition process.

7. The process of claim 1, including the further step of alternating the relative temperatures of said silicon carbide source and said substrate, said epitaxial deposition being alternated in direction depending on the relative temperatures of said source and substrate, said deposition producing pure films of silicon carbide since impurities have a lower transfer rate than said silicon carbide.

8. The process of claim 1, wherein said substrate is a single crystal of silicon carbide.

9. The process of claim 1, wherein said inert atmosphere consists of up to about 10% hydrogen.

References Cited

UNITED STATES PATENTS

| | | | |
|---|---|---|---|
| 3,142,596 | 7/1964 | Theuerer | 148—175 |
| 3,224,911 | 12/1965 | Williams et al. | 148—175 |
| 3,290,181 | 12/1966 | Sirtl | 23—208X |
| 3,291,657 | 12/1966 | Sirtl | 148—175 |
| 3,316,130 | 4/1967 | Dash et al. | 148—175 |
| 3,359,143 | 12/1967 | Heywang et al. | 148—174 |
| 3,447,977 | 6/1969 | Sirtl | 148—174 |
| 3,460,985 | 8/1969 | Sirtl | 117—107.2X |
| 3,461,004 | 8/1969 | Lochner et al. | 148—175 |

L. DEWAYNE RUTLEDGE, Primary Examiner
W. G. SABA, Assistant Examiner

U.S. Cl. X.R.

23—208; 117—106, 107.2; 148—1.5; 156—17